United States Patent [19]

Douglas

[11] Patent Number: 4,793,896

[45] Date of Patent: Dec. 27, 1988

[54] METHOD FOR FORMING LOCAL INTERCONNECTS USING CHLORINE BEARING AGENTS

[75] Inventor: Monte A. Douglas, Coppell, Tex.

[73] Assignee: Texas Instruments Incorporated, Dallas, Tex.

[21] Appl. No.: 159,852

[22] Filed: Feb. 22, 1988

[51] Int. Cl.$^4$ .............................. B44C 122; C03C 15/00; C03C 25/06; C23F 1/02

[52] U.S. Cl. ................................ 156/643; 156/646; 156/656; 156/659.1; 156/667; 204/192.35; 252/79.1; 437/180; 437/228

[58] Field of Search ............... 156/643, 646, 652, 653, 156/655, 656, 659.1, 662, 667; 252/79.1; 204/192.32, 192.35; 437/180, 200, 228; 357/23.1, 65, 67

[56] References Cited

U.S. PATENT DOCUMENTS 4,676,866 6/1987 Tang et al. ..................... 156/643

Primary Examiner—William A. Powell
Attorney, Agent, or Firm—Rodney M. Anderson; Leo N. Heiting; Melvin Sharp

[57] ABSTRACT

A method for etching titanium nitride local interconnects is disclosed. A layer of titanium nitride is formed as a by-product of the formation of titanium silicide by direct reaction; this layer of titanium nitride is present over the titanium silicide layer, as well as over insulators such as oxide. A plasma etch using $CCl_4$ as the etchant is used to etch the titanium nitride anisotropically, and selectively relative to the titanium silicide due to the passivation of the titanium silicide surface by the carbon atoms of the $CCl_4$. Excess chlorine concentration may be reduced, further reducing the undesired etching of the titanium silicide, by providing a consumable power electrode, or by introducing chlorine scavenger gases into the reactor. The plasma may be ignited by exposing the gases to a mercury/argon light source, photodetaching electrons from the anions in the gas.

26 Claims, 1 Drawing Sheet

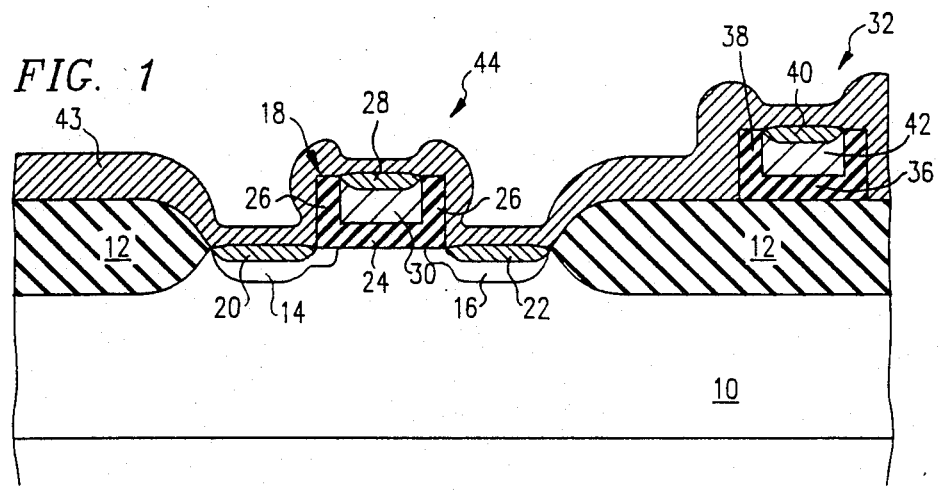
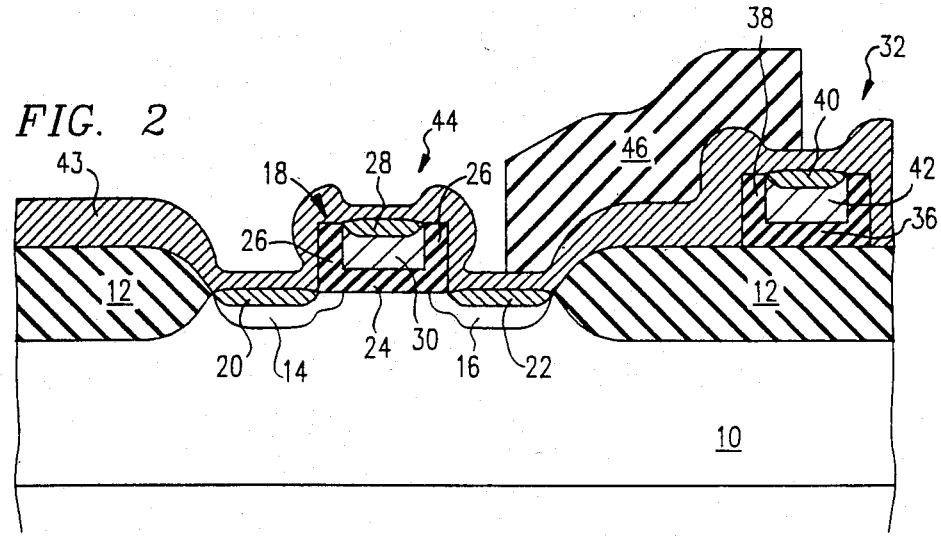
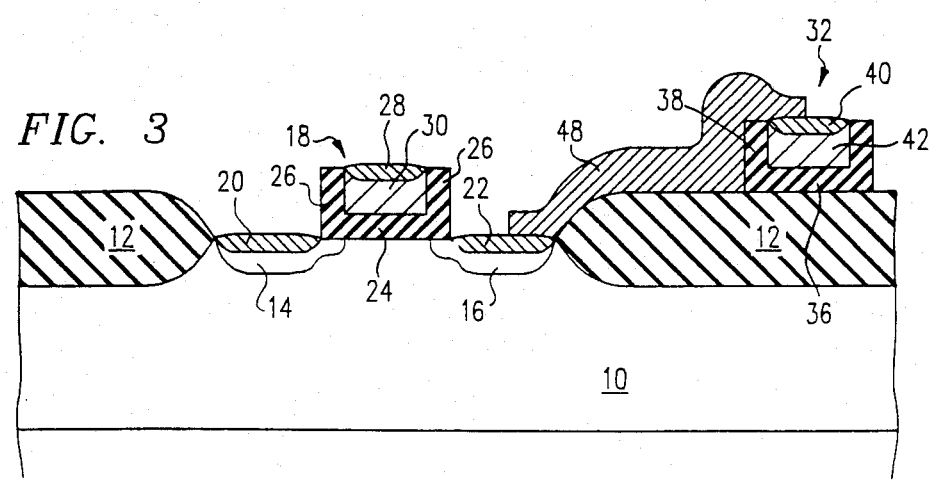

METHOD FOR FORMING LOCAL INTERCONNECTS USING CHLORINE BEARING AGENTS

TECHNICAL FIELD OF THE INVENTION

This invention relates in general to semiconductor devices, and in particular to an improved method for forming local interconnects using chlorine bearing agents.

BACKGROUND OF THE INVENTION

By increasing the number of levels of interconnects in integrated circuits provides additional routing capability, more compact layouts, better circuit performance and greater use of circuit design within a given integrated circuit surface area. A particularly useful level of connection is commonly called local interconnection, where neighboring diffused areas are connected to one another, and to neighboring polysilicon and metal lines.

For example, a conventional method for creating local interconnects uses metal interconnection of diffused regions to one another, as well as to other layers. The metal interconnection is formed by etching vias through a thick oxide layer to the locations to be interconnected. A conductor is then formed to fill the vias and make the connection. This method is limited, for purposes of reducing the area required for such connection, by the state of the technology of etching contact holes and the planarization of interlevel dielectrics. These limitations include the alignment tolerance of the vias to the underlying region to be connected, the size of the via required (and accordingly the size of the contact area in the underlying region) which can be reliably etched, and the step coverage of the conductor in filling the via and making good ohmic contact to the underlying region. Also, the additional layer of a metallic conductor across the dielectric contributes to a loss of planarization in subsequent levels.

An alternative method developed by Hewlett Packard and published at page 118 of the 1984 IEDM Proceedings uses additional patterned silicon to provide conductive silicide regions extending over the field oxide as desired. A layer of titanium is deposited over the substrate and, prior to the direct reaction of the titanium with the underlying silicon to form the silicide, a thin layer of silicon is patterned on top of the titanium metal to define an interconnect extending over a silicon dioxide region separating the two regions to be interconnected. Where this silicon layer remains, a silicide is formed during the reaction process extending over the oxides. This method requires the deposition and patterning of the additional layer of silicon to define the local interconnection. In addition, the resulting silicide strap provides a conduit through which typical n-type dopants such as phosphorous can diffuse, since titanium silicide is a very poor diffusion barrier to conventional semiconductor dopants. If a silicide strap is used to connect n-type regions to p-type regions, for example n-doped polysilicon to b-type diffusion, subsequent processing must be done at relatively low temperatures to minimize the counterdoping of the p-type region with the n-type dopant through the silicide interconnect.

Another known method uses molybdenum metal as a local interconnect material. Molybdenum, however, also acts as a diffusion conduit through which phosphorus, used to dope n-type regions of the semiconductor device, can diffuse. The molybdenum interconnect therefore is not an effective local interconnect between n-type and p-type regions, as the p-type regions can be undesirably counterdoped by the phosphorous diffusing through the molybdenum, similarly as the slicide strap interconnect.

Another local interconnection method is disclosed in U.S. Pat. No. 4,675,073, issued to me on June 23, 1987, and assigned to Texas Instruments Incorporated, incorporated herein by this reference. As disclosed therein, the desired local interconnect is formed by patterning the residual titanium compound, for example titanium nitride, from the direct reaction forming titanium silicide cladding of the diffusions and polysilicon gates. The titanium nitride is sufficiently conductive so that it is useful to make local interconnections between neighboring regions. The disclosed process uses carbon tetrafluoride ($CF_4$) as the reactant in a plasma etch to remove the undesired titanium nitride faster than titanium silicide. This plasma etch using carbon tetrafluoride etches titanium nitride or titanium oxide at approximately twice the rate it removes titanium silicide. This technique also etches silicion oxides at twice the rate, and photoresist at five times the rate, as it etches titanium nitride or titanium oxide. Additionally, products of the etching process include solids that tend to adhere to the etching device. This requires extra maintenance and cleanup time that is nonproductive. Thus, a need has arisen for a method for producing a local interconnect with increased selectivity to the refractory metal compound of the local interconnect (e.g., titanium nitride or titanium oxide) relative to silicides, silicon oxides and photoresist, so that an additional layer of interconnection may be more consistently manufactured with precisely located interconnects and improved planarization compatible with sub-micron technology.

It is therefore an object of this invention to provide an etch for the residual material over insulating layers remaining from the direct react silicidation which has an increased etch rate ratio (i.e., improved selectivity) of the residual material relative to the silicide.

It is a further object of this invention to provide such an etch which also has improved etch selectivity (i.e., an increased etch rate ratio) of the interconnect relative to underlying insulating layers.

It is a further object of the present invention to provide such an etch with improved selectively to titanium nitride or titanium oxide with respect to titanium silicide, silicon dioxide and photoresist.

It is a further object of the present invention to provide such an etch which reduces the preventative maintenance and cleanup schedules and procedures by the use of a chlorine bearing agent as opposed to a flourine agent.

Other objects and advantages of the invention will become apparent to those of ordinary skill in the art having reference to the following specification in conjunction with the drawings.

SUMMARY OF THE INVENTION

The invention may be incorporated into a method for forming a local interconnect on a semiconductor surface is provided. A dielectric layer of a prefabricated integrated circuit is covered with a conductive chemical compound of a refractory metal, such a compound formed during the silicidation of the refractory metal at locations where it is in contact with the underlying semiconductor. A patterned masking material is formed over this chemical compound layer to protect a specific portion thereof. A chlorine bearing agent is used to etch all of the conductive chemical compound layer except that which is protected by the patterned masking material. The chlorine bearing agent etches the conductive chemical compound at a greater rate than the underlying silicide, and then the dielectric layer. The patterned masking material is removed to expose the protected portion which forms a local interconnect on the integrated circuit.

BRIEF DESCRIPTION OF THE DRAWINGS

For a more complete understanding of the present invention, and for further advantages thereof, reference is now made to the following description taken in conjunction with the accompanying drawings in which:

FIG. 1 is a cross-sectional view of a partially fabricated integrated circuit with a titanium chemical compound formed over the entire surface;

FIG. 2 is a cross-sectional view of the device of FIG. 1 with patterned masking material added over the area to be protected;

FIG. 3 is a cross-sectional view of an integrated circuit with a local interconnect formed in accordance with the present invention.

DETAILED DESCRIPTION OF THE INVENTION

FIG. 1 shows the first step utilizing the method of the preferred embodiment of the present invention, as directed to an integrated circuit wafer 44. Wafer 44 contains a semiconducting substrate 10 formed of silicon. Field oxide 12, preferably silicon dioxide ($SiO_2$), is grown or deposited in selected portions of the surface of the substrate 10 for isolation of active regions from one another according to the well known local oxidation (LOCOS) isolation technique; of course, other isolation techniques such as trench isolation may alternatively be used. The active transistors of the integrated circuit device are formed into the locations of the surface of substrate 10 not covered with field oxide 12, such locations commonly called moat regions. In FIG. 1, a transistor 44 is shown having source and drain regions 14 and 16, respectively, diffused into the moat region between two portions of field oxide 12. Source and drain regions 14 and 16 are generally implanted and subsequently diffused after the placement of polysilicon gate electrode 30 over gate dielectric 24, so that source and drain regions 14 and 16 are self-aligned relative to gate electrode 30. As described in U.S. Pat. No. 4,356,623, issued Nov. 11, 1982 and assigned to Texas Instruments Incorporated, the incorporation of sidewall oxide filaments 26 along the side of gate electrode 30 provide for a graded junction, as shown in FIG. 1. FIG. 1 further illustrates a polysilicon layer 42 overlying field oxide 12 serving as an interconnect to another portion of the integrated circuit, for example extending to another moat region (not shown) and serving as the gate electrode for a transistor.

In this embodiment of the invention, source and drain regions 14 and 16, and gate electrodes 30 and 42, are clad with a refractory metal silicide such as titanium silicide. This cladding is performed by depositing a layer of the refractory metal, and subsequently heating the wafer 44 so that the metal directly reacts with the underlying silicon to form the silicide, as described in U.S. Pat. No. 4,384,301, issued on May 17, 1983 and assigned to Texas Instruments Incorporated. An example of the conditions for such direct reaction is heating the wafer 44 in a nitrogen and argon ambient at a temperature on the order of 675° C. Other methods of achieving the direct reaction may alternatively be used, for example, by use of a single-wafer Rapid Thermal Processor (RTP) where the wafer 44 is rapidly heated to the appropriate temperature for a sufficient amount of time to perform the direct reaction described above.

As described in said U.S. Pat. No. 4,675,073, where titanium is used as the refractory metal, as a result of the direct reaction process a layer of a conductive titanium compound covers the surface of the wafer 44, including the silicide regions. Referring to FIG. 1, source region 14, drain region 16, and gate electrodes 28 and 42 are shown clad with titanium silicide film 20, 22, 28 and 40, respectively. A layer 42 of residual material containing, for example, titanium nitride if the direct reaction is performed in a nitrogen atmosphere, remains over the surface; if a layer of oxide (not shown) is provided over the top of the titanium metal layer prior to the direct reaction, as described in U.S. Pat. No. 4,690,730 issued Sept. 1, 1987 and assigned to Texas Instruments Incorporated, layer 43 may contain titanium oxide. Layer 43 will have a thickness on the order of 100 nm over field oxide 12, and will be thinner (e.g., on the order of 40 nm thick) in the locations over silicide film 20, 22, 28 and 40 cladding the underlying silicon or polysilicon. If desired, the thickness of layer 43 may be increased by a second deposition of titanium metal after the initial direct reaction, followed by a second direct reaction in a nitrogen atmosphere, as described in U.S. Pat. No. 4,676,866 issued June 30, 1987 and assigned to Texas Instruments Incorporated.

Referring to FIG. 2, the next step in the preferred embodiment of the present invention is illustrated. A layer of masking material is deposited over layer 43, and is patterned according to conventional techniques to remain in the locations of the eventual local interconnect, as shown by patterned masking material 46 in FIG. 2. The masking material 46 serves to protect the covered portion of layer 43 from subsequent etching. The patterned masking material 46 may be photoresist, or a hardmask material such as silicon dioxide.

When photoresist serves as the masking material 46, it is preferable to clean the surface of wafer 44 prior to beginning the etching process, by use of an $O_2$ based resist descum to establish etch rate uniformity, to prevent extended etch initiation periods and to eliminate post-etch scumming problems or incomplete etching of layer 48. An $O_2$ descum time equal to the removal of approximately 400 Å of resist is sufficient. Wafer 44 is then hardbaked at 120° C. for approximately 60 minutes in an oven and then $O_2$ descummed again. It is necessary to redo the descum if more than a three hour delay is incurred after the descum before the local interconnect dry etch described below to avoid incomplete etching of the local interconnect.

After patterning masking material 46, wafer 44 is placed in any appropriate etching device such as plasma mode etcher, a reactive ion etcher or a microwave after glow, which are well known in the art. In the preferred embodiment, a plasma mode etcher, not shown, utilized. The plasma mode etcher comprises a symmetrical parallel plate reactor with the substrate grounded, and functions in the plasma mode with no DC bias on the powered electrode. The powered top plate comprises graphite or titanium, and the bottom plate may comprise bare aluminum. The plates are spaced approximately one centimeter apart, and approximately 200 watts of power is applied. Radio frequency (RF) energy is transmitted between the parallel plates by an RF generator. The powered electrode also serves as a gas dispersal source similar to a shower head. According to the invention, a chlorine bearing agent such as carbon tetrachloride ($CCl_4$) is used as the dry etch reactant in the plasma mode etcher. Wafer 44 is placed on the grounded plate which is spaced apart from the powered plate by approximately one centimeter. The preferred substrate temperature is on the order of 50° C.

Carbon tetrachloride is a particularly useful chlorine-bearing agent for this etch because it generally exhibits low etch rates of photoresist and silicon dioxide. Carbon tetrachloride also has a carbon center which will serve to "poison" the titanium silicide first layers 20, 22, 28 and 40 once layer 43 of the titanium compound lying over them has been etched. This poisoning, or surface passivation, is due to carbon, probably in the form of a partially dissociated carbon tetrachloride molecule (such as $CCl_x$ where $x=1$, 2 or 3) reacting with either the titanium or the silicon in the titanium silicide film 20, 22, 28 and 40 to form silicon carbide or titanium carbide. Since silicon carbide and titanium carbide are both non-volatile, the reactive sites on the titanium silicide first layers 20, 22, 28 and 40 are effectively "tied up", consumed or covered, thus preventing reaction of layers 20, 22, 28 and 40 with the other reactive species in the etch, namely chlorine. If not passivated, the chlorine in the etch is capable of volatilization and etching of the titanium or the silicon in silicide film 20, 22, 28 and 40. Moreover, the surface passivation from the chlorocarbon reagents can be of such a magnitude that a polymer film is formed, so that the surface passivation is on a macroscopic scale rather than a molecular scale.

Conversely, the reactive carbon containing species will react with the nitrogen component of the titanium nitride in layer 43 to form CN, which is volatile. The residual atomic chlorine radicals will react with the titanium component in the titanium nitride of layer 43 to form titanium chloride ($TiCl_x$ where $x=1-4$), which is also volatile. Thus, the titanium nitride of layer 43 which is not protected by patterned masking material 46 will be etched, while leaving the titanium silicide first layers 20, 22 28 and 40, field oxide 12, and patterned masking material 46.

In order to initiate the plasma, it is necessary to detach electrons from the chlorocarbon anions present in the plasma gas. Because neutral chlorocarbon species have high cross-sections for electron attachment, the reaction chamber tends to become depleted of free electrons, which are crucial to the ignition of the plasma by the mechanism of electron-impact ionization of other atomic and molecular species. Such electron-impact ionization is generally required to ignite the plasma once the avalanche condition is reached. As is well known in the art, the electron is an important charged species in plasma ignition since its low mass allows it to be sufficiently energized by an RF electric field to ionize a neutral species.

A useful method according to the invention for generating sufficient free electrons to ignite the $CCl_4$ plama is to illuminate the reaction chamber with a light source, with the light having a wavelength in the range of 180 to 1200 nanometers. In the preferred embodiment, an intense emission in the ultraviolet end of the spectrum, such as from a mercury/argon light source, will photodetach electrons from anions in the plasma, such anions having a high cross-section for photoelectron detachment. Hence, the light source illumination effectively provides a sufficient free electron concentration by photodetachment from the anions, to permit facile plasma ignition. Alternative techniques for replenishing the free electron concentration for otherwise detaching electrons, by introducing new electrons from an auxiliary source or by temporarily increasing the power of operation to increase the electron energy of a deficient concentration of electrons, can also be used for facilitating ignition.

Once the ignition begins, a plasma is formed resulting in electron-impact dissociation of $CCl_x$ where $x=1-3$, and atomic chlorine radicals. It is also advantageous to add an inert gas, such as helium (He), argon (Ar) or nitrogen ($N_2$) to the carbon tetrachloride to add stability to the plasma.

Molecular and atomic chlorine each can react with titanium or silicon to form volatile gases. The presence of excess chlorine can thus undesirably etch titanium silicide film 20, 22, 28, and 40. Hence, in addition to passivating the surface of silicide film 20, 22, 28 and 40 as described above with the carbon from the $CCl_4$ etchant, it is also desirable to reduce the chlorine concentration in the reaction chamber, further improving the titanium nitride to titanium silicide etch rate ratio. This can be accomplished by adding chlorine scavenging reagents to the carbon tetrachloride. Chlorine scavenging reagents are reagents that react with atomic or molecular chlorine to form a relatively inert or unreactive product, thereby reducing the amount of excess chlorine in the chamber, in turn reducing the undesired etching of titanium or silicon in the titanium silicide film 20, 22, 28 and 40.

One method for providing such a scavenging reagent is the use of a consumable powered electrode, such as one made from graphite or titanium, in the plasma mode etcher. Chlorine is quite reactive with this type of electrode material, depleting the chlorine concentration in the plasma. Another method that can be utilized is to add a reagent such as chloroform ($CHCl_3$), ammonia ($NH_3$), or cyanogen (($CN)_2$) to the carbon tetrachloride. These reagents will dissociate in the plasma mode etcher, and combine with the excess chlorine to form either products which are inert to the silicide film, or which assist the passivation of the silicide film. In the example where chloroform is introduced as a chlorine scavenger, the dissociation of the chloroform liberates hydrogen which will scavenge for chlorine to form hydrochloric acid (HCl) which is not only inert to titanium silicide but is also volatile and easily removed from the reaction chamber. The other product of the scavenging provided by chloroform, namely $CCl_3$, enhances passivation of the titanium silicide surface and participates in etching the titanium nitride in the same manner as the $CCl_4$ etchant gas. If further dry etching is required, a second $O_2$ based resist descum is preferably performed prior to an additional plasma etch step.

However, on surfaces parallel to the ion flux, such as along the sides of sidewall filaments 26, the chlorine bearing agent may leave an interfacial film that resulted from a reaction between the dielectric ($SiO_2$) and the titanium. The plasma etch eradicates the interfacial film on surfaces disposed normal to the ion flux. Since the interfacial film is conductive, it can cause electrical shorts, such as between gate electrode 30 and source and drain regions 14 and 16, respectively. This interfacial film, of unknown composition but believed to be $Ti_xO_ySi_z$, can be removed by a wet etch process.

This wet etch process comprises placing wafer 44 in a diluted solution of, for example, RCA ($NH_4OH + H_2O_2 + H_2O$) in a megasonic agitated tank, i.e., a tank agitated at a frequency greater than 500 kHz. The RCA solution is diluted with approximately six times more $H_2O$ than is normally used in a typical wet etch process for etching silicon. The megasonic tank, not shown, is commercially available with a bottom mount transducer. The bottom mount transducer megasonic tank should be of the type that translates the wafers in a cassette holder back-and-forth across a narrow transducer strip smaller than the wafer diameter. Wafer translation prevents localized heating of the wafer due to standing waves which contributes to early or rapid photoresist delamination. This is in contrast to a bottom-mount megasonic tank in which the entire bottom is a transducer and wafer translation is not part of the procedure. Wafer 44 is placed in the tank for approximately ten minutes which will remove the interfacial film without removing the titanium silicide film 20, 22, 28 and 40 or delaminating photoresist, if used as the masking material 46. To ensure inhibition of photoresist mask delamination, a 60 minute, 120° C. oven bake is performed after the preceding local interconnect dry etch and prior to this wet etch.

Although the dry etch is quite anisotropic to the titanium compound layer 43, the wet etch solution is isotropic and may slightly undercut layer 43 with respect to the masking material 46 slightly. Therefore, it is preferable to oversize the portion of patterned masking material 46 defining the local interconnect; for example, a local interconnect that is 0.8 of a micron wide may require a one micron wide pattern of masking material 46. Both the dry etch and the wet etch steps described herein are selective to the titanium compound layer 43 relative to dielectrics, and, therefore, the field oxide 12 and the sidewall oxides 26 and 38 remain substantially the same height as originally applied.

After the completion of the desired etching steps, patterned masking material 46 is removed by an appropriate method, such as a solvent resist strip for photoresist as masking material 46, as is well known in the art. After the removal of masking material 46, the structure thus appears substantially as shown in FIG. 3, with local interconnect 48 exposed as the remaining portion of layer 43 after removing the masking material 46. The illustrated example of local interconnect 48 extends from drain region 16, contacting silicide film 22 thereat, to contact silicide film 40 located upon gate electrode 42. Local interconnects such as local interconnect 48 can also be used to contact diffused regions to one another, gate electrodes to one another, and also to provide a barrier metal to which contact vias may be etched in providing metal-to-diffusion and metal-to-polysilicon contacts. It should be noted that the compounds described herein for local interconnect 48, such as titanium nitride and titanium oxide, act substantially as a diffusion barrier to photphorous, thereby allowing contact between phosphorous-doped n-type silicon and p-type silicon without the problem of outdiffusion of the n-type dopant through the interconnect 48 into the p-type doped semiconductor.

For improvement of the conductivity of silicide film 20, 22, 28 and 40, an anneal process is now performed on the wafer 44. The anneal process comprises any appropriate method such as sintering the wafer 44 in an oven at 70°–700° C. for approximately 30 minutes. At this point, silicide film 20, 22, 28 and 40 have a change in sheet resistance of less than or equal to 0.3 ohms per square when compared to the sheet resistance of equivalent material that is not exposed to the dry etch.

The desired result of this method is a plasma etch of layer 43 with a high selectivity to the silicide film 20, 22, 28, and 40. In the example where layer 43 is primarily titanium nitride, and where silicide film 20, 22, 28 and 40 is titanium silicide, the result is an etch with a high $TiN:TiSi_2$ etch rate ratio. This high etch rate ratio is important to the performance of the circuit, as such performance depends, in part on the resistance of silicide film 20, 22, 28 and 40. Of course, the resistance of silicide film 20, 22, 28 and 40 is proportional to its thickness. For titanium silicide, overetch of titanium silicide film 20, 22, 28 and 40 by the plasma etch for forming local interconnect 48 increases this resistance, which is undesirable.

Specific examples of the results of various embodiments of the invention are provided hereinbelow. In a first example, the above described procedures with no introduced chlorine scavenging reagents, other than that provided by a graphite top powered electrode graphite was used. Wafer 44 had titanium silicide film 20, 22, 28 and 40, and titanium nitride layer 43. Photoresist was used as masking material 46.

The process conditions were:

| | |
|---|---|
| Carbon tetrachloride flow | 80 SCCM |
| He flow | 30 SCCM |
| Pressure | 350 millitorr |
| Grounded electrode and wafer 44 temperature | 200 watts 50° C. |
| Top powered electrode temperature | 25° C. |

The resultant etch rates produced were:

| | |
|---|---|
| Titanium nitride | 5500 A per minute |
| Titanium silicide | 800 A per minute |
| Oxide | 300 A per minute |
| Photoresist | 200 A per minute |

It can be seen that even without the additional chlorine scavenging reagent such as chloroform an etch rate of roughly 7 to 1 is achieved. Further testing with chloroform added has shown that a 20 to 1 etch rate of titanium nitride to titanium silicide is possible.

Other tests have been conducted to verify the selectivity of the $CCl_4$ etch to titanium nitride relative to titanium silicide. These test measured the amount of titanium silicide etched by measuring a change in sheet resistance of the silicide film. The delta in sheet resistance for a given etch time (pre-etch to post-etch) varies with the amount of $TiSi_2$ etched (i.e., the delta in thickness of the $TiSi_2$ film due to the etch). In the results of group A below, the chloroform flow rate was varied to determine the amount of $TiSi_2$ etched as a function of chloroform flow rate. In the results of group B below, the electrode material was changed, with no chloroform used, to determine the dependency of the $TiSi_2$ on the electrode material. In all examples, the etch time plus overetch time is the time required to clear TiN layer 43.

| flow rate (SCCM) | Etch time (seconds) | Overetch time (seconds) | Change in sheet resistance (ohms/square) |
|---|---|---|---|
| A. Cholorform | | | |
| 0 | 15 | 5 | 2.3 |
| 5 | 15 | 5 | 1.5 |
| 10 | 15 | 5 | 1.1 |
| 20 | 14 | 5 | 1.0 |
| B. Electrode Material | | | |
| Graphite | 17 | 6 | 2.0 |
| Anodized Aluminum | 21 | 5 | 8.3 |
| Titanium | 15 | 5 | 2.5 |

In an alternative embodiment, the titanium layer is covered with a silicon oxide or silicon nitride capping layer prior to the heating reaction to form titanium oxide (TiO) rather than titanium nitride. The silicon oxide layer is removed after reaction in a furnace with a nitrogen ambient at 650° C. The titanium oxide is also conductive and forms a local interconnect after being processed in the same fashion as the titanium nitride.

In this embodiment, the titanium oxide is etched with carbon tetrachloride using the same process as previously described above. Instead of forming CN, however, carbon monoxide (CO) is formed, while all other reactions are essentially the same.

Although the present invention has been described with respect to a specific preferred embodiment thereof, various changes and modifications may be suggested to one skilled in the art, and it is intended that the present invention encompass such changes and modifications as fall within the scope of the appended claims.

What is claimed is:

1. A method for dry etching a conductive titanium chemical compound formed over a dielectric and a silicide on a semiconductor surface, comprising the steps of:
   disposing the semiconductor surface within a plasma etcher;
   flowing a chlorine bearing agent into said plasma etcher and over the semiconductor surface;
   igniting said chlorine bearing agent to form plasma; and
   etching the titanium chemical compound with said plasma without undesirably etching the dielectric from the semiconductor surface.

2. The method of claim 1, wherein the chemical compound is titanium nitride or titanium oxide.

3. The method of claim 1, further comprising: mixing a chlorine scavenging reagent with the chlorine bearing agent in said flowing step.

4. The method of claim 1, wherein the chlorine bearing agent is carbon tetrachloride.

5. The method of claim 4, wherein the step of flowing further includes mixing an inert gas with said carbon tetrachloride.

6. The method of claim 1, wherein the step of igniting comprises passing radio frequency energy through said plasma etcher.

7. The method of claim 6, wherein the step of igniting further includes shining ultraviolet light through said plasma etcher.

8. A method for forming a local interconnect at a silicon surface, comprising the steps of:
   forming an insulating layer over a selected location of said surface;
   forming a layer of titanium silicide in contact with the silicon surface at a location adjacent said insulating layer;
   forming an interconnect layer of material comprising titanium over said titanium silicide and said insulating layer;
   forming a protective masking material over a specific portion of said interconnect layer to define an interconnect; and
   etching said interconnect layer with a chlorine bearing agent in a plasma reactor to remove all of said interconnect layer except said defined interconnect.

9. The method of claim 8, wherein the steps of forming said titanium silicide layer and said interconnect layer comprise:
   depositing a layer of titanium over the silicon surface and said insulating layer;
   reacting said titanium in a nitrogen and argon ambient at a temperature sufficient to cause the titanium layer to react with said silicon surface to form a layer of titaniuim silicide covered with a layer of titanium nitride, and to form a layer of titanium nitride over said insulating layer.

10. The method of claim 9, wherein the step of etching further includes passivating said titanium silicide with radicals dissociated from said chlorine bearing agent.

11. The method of claim 8, wherein the step of forming a protective masking material over a specific portion of said second layer comprises patterning photoresist over said second layer.

12. The method of claim 8, wherein the step of etching comprises plasma etching with carbon tetrachloride.

13. The method of claim 12, wherein the step of etching further includes mixing a chlorine scavenging reagent with aid carbon tetrachloride.

14. The method of claim 13, wherein the step of etching further includes mixing an inert gas with said carbon tetrachloride.

15. The method of claim 12, wherein the step of etching further includes providing an electrode in said plasma reactor which reacts with chlorine.

16. The method of claim 12, wherein the step of etching further includes igniting said carbon tetrachloride to form plasma by adding a mercury/argon ultraviolet light source.

17. The method of claim 8, wherein the steps of forming said titanium silicide layer and said interconnect layer comprise:
   depositing a layer of titanium over the silicon surface and said insulating layer;
   depositing silicon oxide over said titanium; and
   reacting said titanium in a nitrogen and argon ambient in a furnace at approximately 650° C. to cause the titanium layer to react with said silicon surface to form a layer of titanium silicide covered with a layer of titanium oxide, and to form a layer of titanium oxide over said insulating layer.

18. The method of claim 8, further comprising:
   wet etching with a water diluted ammonium hydroxide/hydrogen peroxide solution in an agitated tank having a bottom-mounted transducer, after said etching step.

19. A method for etching a material disposed on a semiconductor wafer, comprising:
   disposing the wafer within a reactor chamber;

flowing an etchant gas into said reactor chamber;
illuminating the reactor chamber with a light source to cause the etchant gas to form a plasma.

20. The method of claim 19, wherein the etchant gas is a chlorine-bearing agent.

21. The method of claim 20, wherein the etchant gas is $CCl_4$.

22. The method of claim 20, wherein the light from the light source has a wavelength in the range of 180 to 1200 nanometers.

23. The method of claim 20, wherein the material to be etched comprises a conductive refractory metal compound.

24. The method of claim 23, wherein the refractory metal in the conductive refractory metal compound is titanium.

25. The method of claim 24, wherein the conductive refractory metal compound comprises titanium nitride.

26. The method of claim 24, wherein the conductive refractory metal compound comprises titanium oxide.

* * * * *

(12) REEXAMINATION CERTIFICATE (4471st)
United States Patent
Douglas

(10) Number: US 4,793,896 C1
(45) Certificate Issued: *Oct. 23, 2001

(54) METHOD FOR FORMING LOCAL INTERCONNECTS USING CHLORINE BEARING AGENTS

(75) Inventor: Monte A. Douglas, Coppell, TX (US)

(73) Assignee: Texas Instruments Incorporated, Dallas, TX (US)

Reexamination Request:
No. 90/004,603, Apr. 9, 1997

Reexamination Certificate for:
Patent No.: 4,793,896
Issued: Dec. 27, 1988
Appl. No.: 07/159,852
Filed: Feb. 22, 1988

(*) Notice: This patent is subject to a terminal disclaimer.

(51) Int. Cl.[7] ............... B44C 1/22; C03C 15/00; C03C 25/06; C23F 1/02

(52) U.S. Cl. ............ 156/643; 156/646; 156/656; 156/659.1; 156/667; 204/192.35; 252/79.1; 437/180; 437/228

(58) Field of Search ............... 156/643, 646, 156/656, 659.1, 667; 204/192.32, 192.35; 437/180, 200, 228; 357/23.1, 65, 67

(56) References Cited

U.S. PATENT DOCUMENTS

| | | | |
|---|---|---|---|
| 4,574,177 | 3/1986 | Wang | 219/121 |
| 4,657,628 | 4/1987 | Holloway et al. | 156/643 |
| 4,676,866 | 6/1987 | Tang et al. | 156/643 |

FOREIGN PATENT DOCUMENTS

| | | |
|---|---|---|
| 54-94196 | 7/1979 | (JP) . |
| 59-175726 | 10/1984 | (JP) . |
| 59-212107 | 10/1984 | (JP) . |
| 61-183942 | 8/1986 | (JP) . |

OTHER PUBLICATIONS

Yoneda et al, "Semiconductor process and electrochemistry, Semiconductor dry etching techniques", Denki Kogaku vol. 55, No. 8, pp. 583–586, abs only, Aug. 1987.*

Shah, Pradeep L., "Refractory Metal Gate Processes for VLSI Applications", IEEE Transactions on Electron Devices, vol. ED–26, No. 4, Apr. 1979, pp. 631–640.

Donnelly, Vincent M.; Flamm, Daniel L., "Anisotropic Etching in Chlorine–Containing Plasmas", Solid State Technology, vol. 24, No. 4, 1981, pp. 161–166.

Chow, T. P., Stecki, A. J., "Plasma Etching of Regractory Gates for VLSI Applications", J. Electrochem. Soc.: Solid–State Science and Technology, vol. 131, No. 10, pp. 2325–2335.

T. Maeda et al., "Effects of Ti Interlevel Existence in Al/Ti/TiN/Ti Structure for Highly Reliable Interconnection", 1985 Symposium on VLSI Technology, May 14–16, 1985/KOBE, pp. 50, 51.

* cited by examiner

*Primary Examiner*—Robert Kunemund

(57) ABSTRACT

A method for etching titanium nitride local interconnects is disclosed. A layer of titanium nitride is formed as a by-product of the formation of titanium silicide by direct reaction; this layer of titanium nitride is present over the titanium silicide layer, as well as over insulators such as oxide. A plasma etch using $CCl_4$ as the etchant is used to etch the titanium nitride anisotropically, and selectively relative to the titanium silicide due to the passivation of the titanium silicide surface by the carbon atoms of the $CCl_4$. Excess chlorine concentration may be reduced, further reducing the undesired etching of the titanium silicide, by providing a consumable power electrode, or by introducing chlorine scavenger gases into the reactor. The plasma may be ignited by exposing the gases to a mercury/argon light source, photodetaching electrons from the anions in the gas.

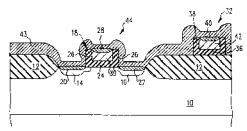

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–7 and 19–26 are cancelled.

Claims 8 and 10 are determined to be patentable as amended.

Claims 9 and 11–18, dependent on an amended claim, are determined to be patentable.

New claims 27–35 are added and determined to be patentable.

8. A method for forming a local interconnect at a silicon surface, comprising the steps of:
forming an insulating layer over a selected location of said surface;
forming a layer titanium silicide in contact with the silicon surface at a location adjacent said insulating layer;
forming an interconnect layer of material comprising titanium over said titanium silicide and said insulating layer;
forming a protective masking material over a specific portion of said interconnect layer to define an interconnect; and
etching said interconnect layer with a chlorine bearing agent *comprising a passivating center* in a plasma reactor to remove all of said interconnect layer except said defined interconnect.

10. The method of claim 9, wherein the step of etching further includes passivating said titanium silicide with radicals *comprising passivating centers* dissociated from said chlorine bearing agent.

12. The method of claim 8, wherein the step of etching comprises plasma *mode* etching with carbon tetrachloride.

*27. A method for dry etching a conductive material comprising a titanium chemical compound, said conductive material being formed over a dielectric and over a silicide on a semiconductor surface, comprising the steps of:*
*disposing the semiconductor surface within a plasma etcher;*
*flowing a first chlorine bearing agent into said plasma etcher and over the semiconductor surface, said first chlorine bearing agent comprising one or more passivants and one or more chlorine atoms in a first chlorine-to-passivant ratio;*
*flowing a second chlorine bearing agent into said plasma etcher and over the semiconductor surface, said second chlorine bearing agent comprising one or more passivants and one or more chlorine atoms in a second chlorine-to-passivant ratio, said second ratio different from said first ratio;*
*flowing an inert nitrogen gas into said plasma etcher;*
*igniting said chlorine bearing agents to form plasma; and*
*etching said titanium chemical compound with said plasma without undesirably etching said dielectric from the semiconductor surface.*

*28. The method of claim 27, wherein said chemical compound comprises titanium nitride.*

*29. The method of claim 27, wherein said first chlorine bearing agent comprises carbon tetrachloride.*

*30. The method of claim 27, wherein said passivant is $CCl_x$.*

*31. The method of claim 27, wherein said second chlorine bearing agent comprises ammonia.*

*32. The method of claim 27, wherein said second chlorine bearing agent comprises chloroform.*

*33. The method of claim 27, wherein said plasma etcher is a reactive ion etching apparatus.*

*34. A method for dry etching a conductive material comprising a titanium chemical compound, said conductive material being formed over a dielectric and over a silicide on a semiconductor surface, comprising the steps of:*
*disposing the semiconductor surface within a plasma etcher;*
*flowing a first chlorine bearing agent into said plasma etcher and over the semiconductor surface, said first chlorine bearing agent comprising one or more passivants and one or more chlorine atoms in a first chlorine-to-passivant ratio, wherein the passivant comprises $CCl_x$;*
*flowing a second chlorine bearing agent into said plasma etcher and over the semiconductor surface, said second chlorine bearing agent comprising one or more passivants and one or more chlorine atoms in a second chlorine-to-passivant ratio, said second ratio different from said first ratio;*
*igniting said chlorine bearing agents to form plasma; and*
*etching said titanium chemical compound with said plasma without undesirably etching said dielectric from the semiconductor surface.*

*35. A method for dry etching a conductive material comprising a titanium chemical compound, said conductive material being formed over a dielectric and over a silicide on a semiconductor surface, comprising the steps of;*
*disposing the semiconductor surface within a plasma etcher;*
*flowing a first chlorine bearing agent into said plasma etcher and over the semiconductor surface, said first chlorine bearing agent comprising one or more passivants and one or more chlorine atoms in a first chlorine-to-passivant ratio;*
*flowing a second chlorine bearing agent into said plasma etcher and over the semiconductor surface, said second chlorine bearing agent comprising one or more passivants and one or more chlorine atoms in a second chlorine-to-passivant ratio, said second ratio different from said first ratio, wherein the second chlorine bearing agent comprises chloroform;*
*igniting said chlorine bearing agents to form plasma; and*
*etching said titanium chemical compound with said plasma without undersirably etching said dielectric from the semiconductor surface.*

* * * * *